(12) United States Patent
Kiel

(10) Patent No.: US 11,177,139 B2
(45) Date of Patent: Nov. 16, 2021

(54) ELECTRONIC CARD WITH PRINTED CIRCUIT COMPRISING AN ANTENNA WITH INTEGRATED SLOTS AND METHOD FOR THE PRODUCTION THEREOF

(71) Applicant: INSTITUT VEDECOM, Versailles (FR)

(72) Inventor: Friedbald Kiel, Fontainebleau (FR)

(73) Assignee: INSTITUT VEDECOM, Versailles (FR)

( * ) Notice: Subject to any disclaimer, the term of this patent is extended or adjusted under 35 U.S.C. 154(b) by 189 days.

(21) Appl. No.: 16/480,304

(22) PCT Filed: Jan. 29, 2018

(86) PCT No.: PCT/FR2018/050195
§ 371 (c)(1),
(2) Date: Jul. 23, 2019

(87) PCT Pub. No.: WO2018/142051
PCT Pub. Date: Aug. 9, 2018

(65) Prior Publication Data
US 2019/0371622 A1    Dec. 5, 2019

(30) Foreign Application Priority Data

Feb. 1, 2017    (FR) ...................................... 1750851

(51) Int. Cl.
*H01L 21/48*         (2006.01)
*H01Q 13/18*         (2006.01)
(Continued)

(52) U.S. Cl.
CPC ......... *H01L 21/4857* (2013.01); *H01Q 13/18* (2013.01); *H01Q 21/064* (2013.01);
(Continued)

(58) Field of Classification Search
CPC .. H01L 21/4857; H01Q 13/18; H01Q 21/064; H05K 1/145
(Continued)

(56) References Cited

U.S. PATENT DOCUMENTS

| | | |
|---|---|---|
| 6,049,311 A | 4/2000 | Alexanian |
| 2004/0004576 A1 | 1/2004 | Anderson |

(Continued)

FOREIGN PATENT DOCUMENTS

| | | |
|---|---|---|
| EP | 2564466 B1 | 4/2014 |
| FR | 2901062 A1 | 11/2007 |
| WO | 2011030277 A2 | 3/2011 |

OTHER PUBLICATIONS

International Search Report for PCT/FR2018/050195 dated May 8, 2018.
Written Opinion for PCT/FR2018/050195 dated May 8, 2018.

*Primary Examiner* — Elias Ullah
(74) *Attorney, Agent, or Firm* — Sandberg Phoenix & von Gontard, P.C.

(57) ABSTRACT

The electronic card with printed circuit (1) comprises at least one antenna with slots (AT) including a cavity (15) and a metal conductive layer (17) covering the cavity and having a plurality of slots (S17). The slots form openings in the metal conductive layer. In accordance with the invention, the cavity is formed, by removal of material, in the thickness of the printed circuit. The cavity also comprises a metallisation layer (16) on the walls and the metal conductive layer is formed in a plate attached on the electronic card with printed circuit and closes the cavity.

13 Claims, 3 Drawing Sheets

(51) Int. Cl.
 *H01Q 21/06* (2006.01)
 *H05K 1/14* (2006.01)
 *H05K 3/46* (2006.01)

(52) U.S. Cl.
 CPC ........... *H05K 1/145* (2013.01); *H05K 3/4697* (2013.01); *H05K 2201/10098* (2013.01); *H05K 2203/063* (2013.01)

(58) Field of Classification Search
 USPC ....................................................... 438/107
 See application file for complete search history.

(56) References Cited

U.S. PATENT DOCUMENTS

| | | |
|---|---|---|
| 2009/0151150 A1 | 6/2009 | Ayala et al. |
| 2011/0203836 A1 | 8/2011 | Yokota et al. |
| 2013/0032388 A1 | 2/2013 | Lin et al. |
| 2013/0292826 A1 | 11/2013 | Lin et al. |
| 2014/0246227 A1 | 9/2014 | Lin et al. |

ELECTRONIC CARD WITH PRINTED CIRCUIT COMPRISING AN ANTENNA WITH INTEGRATED SLOTS AND METHOD FOR THE PRODUCTION THEREOF

CROSS-REFERENCE TO RELATED APPLICATIONS

This application is the US National Stage under 35 USC § 371 of International Application No. PCT/FR2018/050195, filed 29 Jan. 2018 which claims priority to French application 1750851 filed on 1 Feb. 2017, the content (text, drawings and claims) of both said applications being incorporated herein by reference.

BACKGROUND

The invention concerns the general field of wireless communications. More specifically, the invention relates to an electronic printed circuit board, comprising at least one integrated slotted antenna. The invention also relates to a method for the production of an electronic printed circuit board comprising this slotted antenna.

Wireless communications via microwave radio-relay systems have developed spectacularly over the past twenty years or so. As a result of the convergence between the internet, IT, audiovisual technology, cell-phone networks, and the availability of high-performance mobile communication terminals, new communication methods have emerged. Various types of well-known wireless communication technologies have been developed: for example, technology specified by the Bluetooth® standards for personal wireless networks, WiFi® for local wireless networks, and UMTS® and LTE® for wireless cell-phone networks.

Even more significant growth is foreseen with the development of connected objects and the emergence of so-called "ambient computing," whereby people and objects in the same environment can communicate via wireless networks. Objects are fitted with "chips" and means of wireless communication, enabling them to adapt and interact with their environment and with people.

On-board wireless networks in the various air, road, rail and sea transportation means are also set to experience rapid growth. Deploying a large number of sensors via a wireless network also has many applications: for example, in the fields of instrumentation, the environment, home automation, healthcare, process monitoring and safety.

Radio antennas are key components for wireless communication devices and represent a significant obstacle to the miniaturization of radio communication modules and cost reduction. The miniaturization of radio antennas and their reduced cost are desirable to facilitate the integration of wireless communication modules into systems, and in particular, those of the SiP (System in Package) type.

Slotted microantennas in ultrahigh and microwave frequency bands are used for cellular telephony. The inventor is thus aware of a slotted antenna inserted into a printed circuit board and which is typically fitted to cell phones in the frequency band spanning from 800 MHz to 1 GHz. However, this antenna offers limited radio performance, particularly in terms of gain.

Slotted antennas of the waveguide type or with a cavity offer improved performance. Such antennas are, for example, described in the U.S. Pat. No. 6,049,311A, EP App. No. 2564466A1, and US Pub. No. 2004/004576A1. However, with regard to these state of the art antennas, the addition of a waveguide or a cavity increases the antenna's overall dimension and has a significant impact on its cost.

The expected major growth in the wireless communication network market requires technological progress for slotted antennas that offer good performance and can be inserted into electronic printed circuit boards, with reduced overall dimensions and costs, to produce an SiP-type (System in Package).

SUMMARY

According to a first aspect, an electronic printed circuit board is disclosed which comprises at least one slotted antenna, with the slotted antenna comprising a cavity and a conductive metal layer covering the cavity and featuring multiple slots, with the slots forming openings in the conductive metal layer.

In accordance with an aspect of the printed circuit board, the cavity is formed through the removal of material in the thickness direction of the electronic printed circuit board and includes a metallization layer on the walls of the cavity, and the conductive metal layer, featuring multiple slots, is formed in a wafer transferred onto the electronic printed circuit board and closes the cavity.

According to a specific characteristic, the conductive metal layer with multiple slots is supported on a dielectric layer closing the cavity, the conductive metal layer being positioned outside the cavity.

According to a specific characteristic, the conductive metal layer with multiple slots is supported on a dielectric layer closing the cavity, the conductive metal layer being positioned inside the cavity.

According to another specific characteristic, the conductive metal layer with multiple slots and the dielectric layer are formed in a CCL-type laminate wafer or an RCC-type wafer.

According to another specific characteristic, the metallization layer is made of copper.

Depending on the specific embodiment, the electronic printed circuit board comprises a number of slotted antennas, with the slotted antennas being combined within a network of antennas.

According to another specific characteristic, the electronic printed circuit board is of the multilayer type.

According to another specific embodiment, the electronic printed circuit board includes a radio transmitter comprising at least one slotted antenna and an electronic component positioned at the bottom of the cavity of the slotted antenna.

According to another specific characteristic, the electronic printed circuit board comprises a conductor in contact with the electronic component, whose function is to extract heat generated by the electronic component.

According to another specific embodiment, the electronic printed circuit board includes a radio transmitter comprising at least one slotted antenna and an electronic component positioned at the bottom of the cavity of the slotted antenna.

According to another aspect, a production method for an electronic printed circuit board is also disclosed, wherein the electronic printed circuit board comprises at least one slotted antenna, with the slotted antenna comprising a cavity and a conductive metal layer featuring multiple slots. The slots form openings in the conductive metal layer, with the production method including photolithographic and etching steps. In accordance with an aspect of the method, the production method includes a step to remove material in order to form the cavity in the the thickness direction of the electronic printed circuit board, a metallization step to form a metallization layer on the cavity walls, and a step to transfer a wafer including a conductive metal layer onto the electronic printed circuit board so as to close the cavity.

According to a specific characteristic, the production method also comprises a step to laminate a number of printed circuit wafers to form the printed circuit board.

DESCRIPTION OF THE FIGURES

Other advantages and characteristics of this invention will become more apparent by reading the detailed description below of various specific embodiments of the invention, with reference to the appended drawings, in which.

DETAILED DESCRIPTION

With reference to FIGS. 1, 2A, 2B and 3, the steps to produce a specific embodiment of a slotted antenna in an electronic printed circuit board are described.

Figure 1:
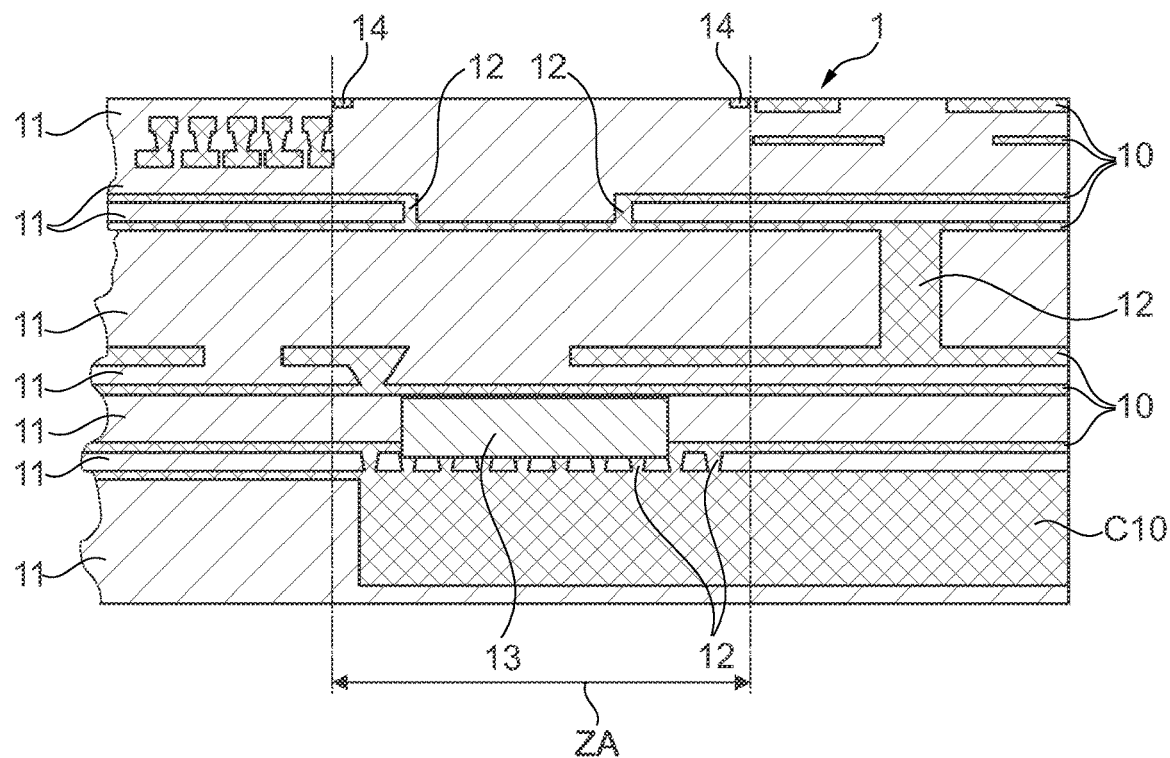
FIG. 1 is a partial sectional view of an electronic printed circuit board in a state before a slotted antenna is inserted to produce an electronic board.

FIG. 1 shows a multilayer-type electronic printed circuit board 1 into which the slotted antenna must be inserted.

As shown in FIG. 1, the standard form of the electronic printed circuit board 1 comprises multiple conductive copper layers 10 and dielectric layers 11. Conductive connection patterns are formed in the conductive layers 10 and in through holes 12 to interconnect the conductive patterns located in the various layers. The active and passive electronic circuit components, such as the electronic component 13, are buried between the inner layers of the board 1 during its production.

Well-mastered production techniques for printed circuit boards are generally used to produce the multilayer electronic printed circuit board 1. Thus, the production method may use copper-clad laminates (CCL), which may or may not be filled with fiberglass; dielectrics preimpregnated with epoxy-type resin (called prepeg); thin copper sheets or wafers, possibly coated with resin, of the RCC-type (Resin-Coated Copper); and adhesives. The production method may use a combination of techniques, including lamination, photolithography, wet etching, electroplating, mechanical and/or laser milling and drilling, and other techniques.

The ZA area, shown in FIG. 1, is the area of the board 1 into which the slotted antenna must be inserted. An electronic component 13 is inserted into this area ZA, which in this embodiment is an RF transistor for transmitting electromagnetic waves. The goal here is to produce a radio transmitter by combining a slotted antenna with the transistor 13. Of course, a radio receiver in the board 1 will be produced in a similar way.

As shown in FIG. 1, the transistor 13 is buried between the inner layers 10, 11 of the board 1. The transistor 13 includes electrodes, not visible in FIG. 1, which are welded to a copper connection pattern in the board 1.

A conductor C10, comprised of a thick copper layer, is provided to cool down the transistor 13. The function of this conductor C10 is to extract heat generated by the transistor 13 into a heat sink (not shown). Through holes 12 are created here to link a metal surface of the transistor 13 to the conductor C10. The conductor C10 may or may not be required, depending on the power of the radio transmitter. When the conductor C10 is required, its dimensions will vary according to the heat load to be evacuated. The conductor C10 is less likely to be required in the case of a radio receiver.

Figure 2A:
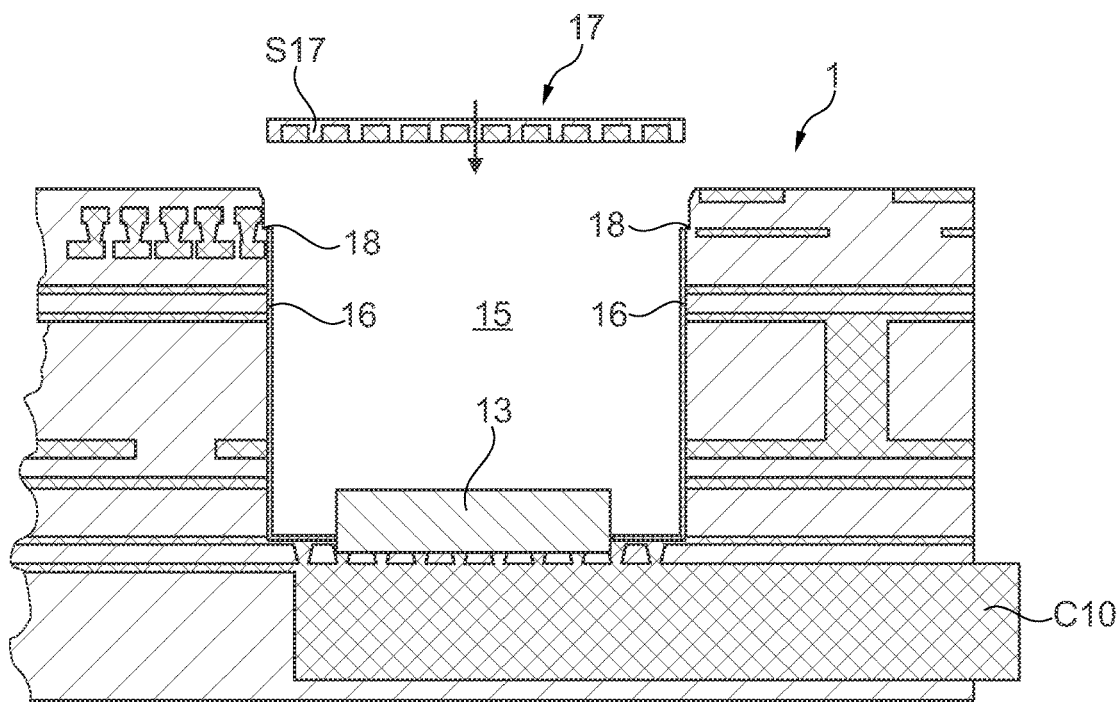
FIG. 2A is a partial sectional view of the electronic printed circuit board shown in FIG. 1, in which a cavity of the slotted antenna has been formed.

An antenna cavity 15, shown in FIG. 2A, is integrated in the thickness direction of the board 1. In this embodiment, an indexing pattern, shown as 14 in FIG. 1, has been formed on the top face of the board 1 so as to allow indexing of the material-removing tool used to hollow out the cavity 15.

As shown in FIG. 2A, material is removed above the transistor 13 to extract the desired volume for the cavity 15. This material is typically removed using a milling cutter, laser and/or photochemical etching techniques enabling the metal layers to be cut accurately.

The dimensions of the cavity 15 are typically determined according to the carrier wavelength.

The walls of the cavity 15 are then coated with a metallization layer 16, typically copper, so as to form a waveguide. The metallization layer 16 is formed here by electroplating.

Figure 2B:
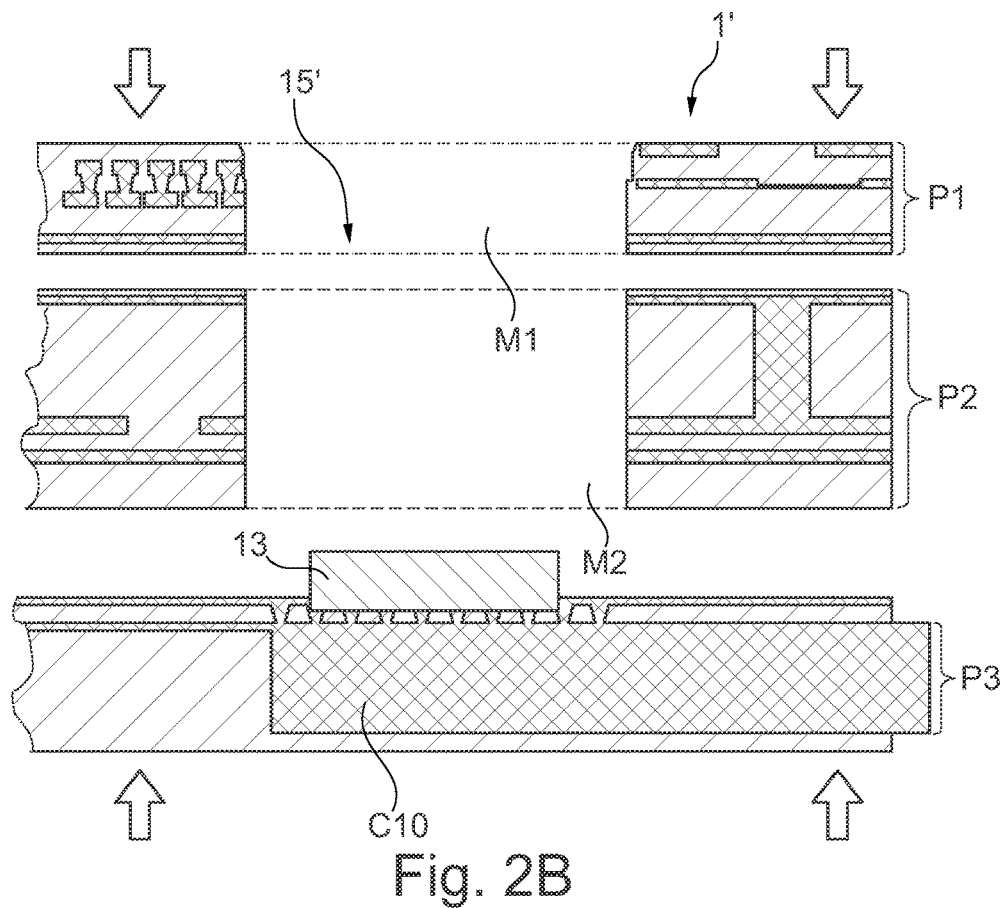
FIG. 2B is a partial sectional view of a number of printed circuit wafers before they are laminated to form the electronic printed circuit board featuring the cavity of the slotted antenna.

According to another embodiment shown in FIG. 2B, an electronic printed circuit board 1' with integrated antenna cavity 15' is formed by laminating a number of printed circuit wafers. The embodiment in FIG. 2B has three printed circuit wafers, i.e. P1, P2 and P3.

Each of the wafers P1, P2 and P3 is formed using production techniques for multilayer printed circuit boards. Removal of material M1, M2 is carried out here in wafers P2, P3 so as to remove a total volume corresponding to the desired volume for the cavity 15'. This removal of material M1, M2 is carried out in a similar way to the removal of material for the cavity 15, i.e. using a milling cutter, laser and/or photochemical etching techniques.

The wafers P1, P2 and P3 are then laminated by pressing and passing through a vacuum laminating oven, after their lamination surfaces have been coated, for example, with an epoxy-type polymerizable resin to ensure their bonding. Produced in this manner is the multilayer electronic printed circuit board 1' with the cavity 15'. As in the case of the cavity 15' of the board 1, a metallization layer (typically made of copper) is applied to the walls of the cavity 15' so as to form a waveguide. At this production stage, the board 1' is in the same state as the board 1 shown in FIG. 2A.

The description below continues by considering the electronic printed circuit board 1 at the production stage shown in FIG. 2A.

The installation of a wafer 17, designed to close the upper part of the cavity 15, completes the production of the antenna. The wafer 17 is typically a printed circuit wafer in which multiple slots S17 are formed, and which can be seen in FIG. 2A. The slots S17 form openings in the metal layer of the electronic printed circuit board.

A flange 18 is provided at the top of the walls of the cavity 15. The flange 18 guarantees the exact position of the wafer 17 in the opening of the cavity 15. It must be positioned exactly in order to respect the defined dimensions of the antenna. The wafer 17 is secured by means of bonding in the opening of the cavity 15.

Figure 3:
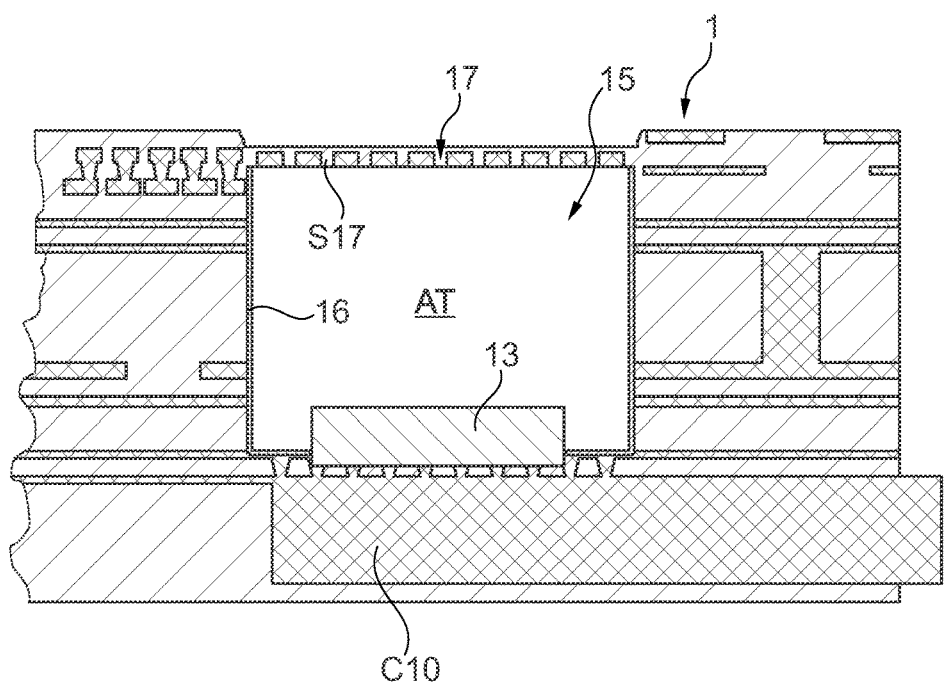
FIG. 3 is a partial sectional view of the electronic printed circuit board shown in FIG. 1, in which the slotted antenna has been integrated.

The antenna AT is shown in its completed state in FIG. 3. As shown by FIG. 3, the antenna AT is fully integrated into the electronic printed circuit board 1.

Various embodiments of the slotted wafer are shown in FIGS. 4A, 4B, 5A, 5B and 6A, 6B.

FIGS. 4A, 4B, and 5A, 5B respectively show the first and second embodiments 17a and 17b of the slotted wafer. The slotted wafers 17a and 17b are equivalent, except for the fact that wafer 17a closes the cavity 15 of the antenna AT with its copper surface CF positioned outside the cavity 15, whereas wafer 17b closes the cavity 15 of the antenna AT with its copper surface CF positioned inside the cavity 15.

The slotted wafer 17a, 17b is produced, for example, from a thin laminate wafer (CCL) or an RCC wafer with a dielectric layer DF and a copper layer CF.

Figure 4A:
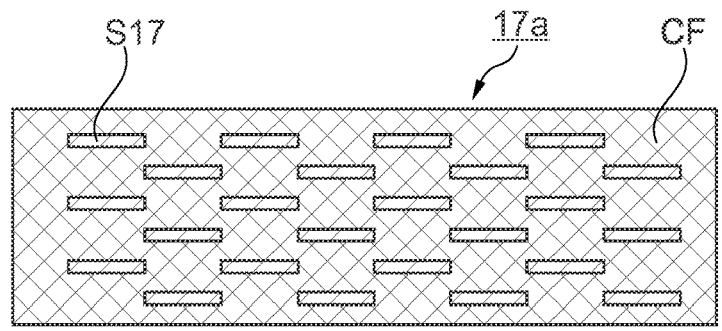
FIGS. 4A and 4B are top and side views of a first example of a slotted wafer included in the antenna.
Figure 4B:
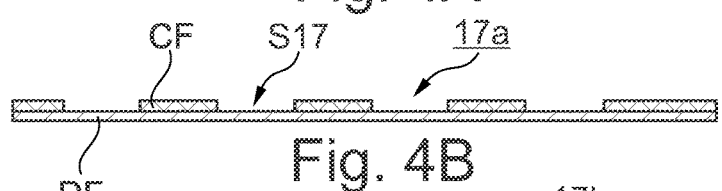
Figure 5A:
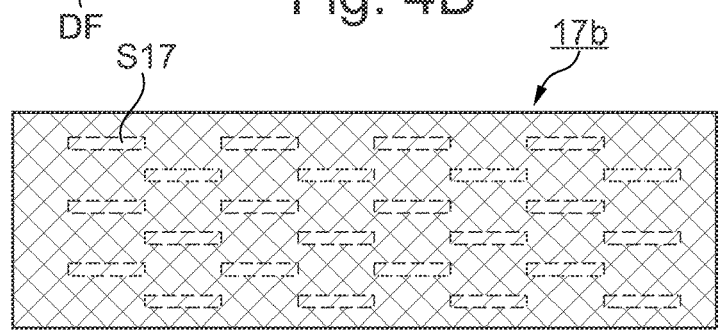
FIGS. 5A and 5B are top and side views of a second example of a slotted wafer included in the antenna.
Figure 5B:
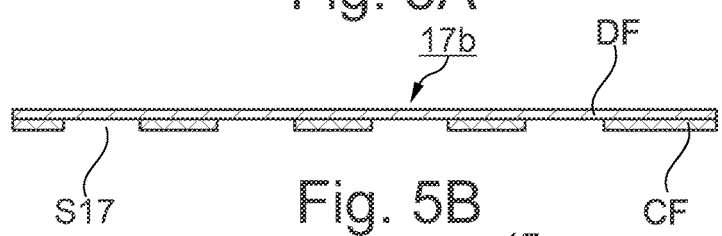

The slot patterning shown in FIG. 4A is achieved using standard photolithographic and engraving techniques. The slots S17 are produced by removing copper. The slots S17 maintain the dielectric layer.

Figure 6A:
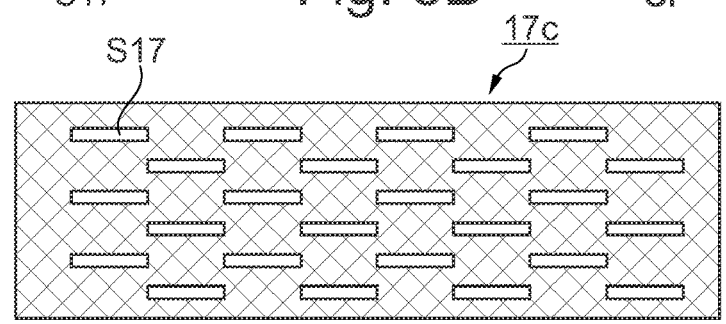
FIGS. 6A and 6B are top and side views of a third example of a slotted wafer included in the antenna.
Figure 6B:
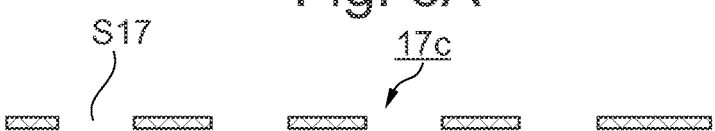

FIGS. 6A, 6B show a third embodiment 17c of the slotted wafer.

The slotted wafer 17c here is produced from a thin wafer of copper. The slot patterning is achieved, for example, through photochemical etching.

Of course, in some applications, several antennas in accordance with the invention may be combined within a network and produced on the same electronic printed circuit board. It would therefore be possible to produce the desired lobe forms.

The invention is not restricted to the specific embodiments described here by way of examples. A person skilled in the art, in accordance with the invention's application, may apply various modifications and alternatives within the scope of the appended claims.

The invention claimed is:

1. An electronic printed circuit board comprising at least one slotted antenna, said slotted antenna comprising:
   a cavity defined in said electronic circuit board, said cavity comprising a wall and a floor, at least said wall having a metallization layer thereon; and
   a conductive metal layer covering said cavity, said conductive metal layer having opposed major surfaces and multiple slots formed in one of said major surfaces defining openings in said conductive metal layer,
   wherein said cavity is formed, through the removal of material, in the thickness direction of said electronic printed circuit board, and
   wherein said conductive metal layer, featuring said multiple slots, is formed in defined by a wafer and is added to said electronic printed circuit board such that said conductive metal layer closes said cavity.

2. The electronic printed circuit board according to claim 1, wherein said conductive metal layer, featuring said multiple slots, is supported by a dielectric layer closing said cavity, with said conductive metal layer being positioned outside said cavity.

3. The electronic printed circuit board according to claim 2 wherein said conductive metal layer, featuring said multiple slots, and said dielectric layer are formed in a CCL-type laminate wafer or an RCC-type wafer.

4. The electronic printed circuit board according to claim 1, wherein said conductive metal layer, featuring said multiple slots, is supported by a dielectric layer closing said cavity, with said conductive metal layer being positioned inside said cavity.

5. The electronic printed circuit board according to claim 4 wherein said conductive metal layer, featuring said multiple slots, and said dielectric layer are formed in a CCL-type laminate wafer or an RCC-type wafer.

6. The electronic printed circuit board according to claim 1, wherein said metallization layer is made of copper.

7. The electronic printed circuit board according to claim 1, wherein said electronic printed circuit board comprises a plurality of said slotted antennas, with said slotted antennas being combined within a network of antennas.

8. The electronic printed circuit board according to claim 1, wherein said electronic circuit board is of the multilayer type.

9. The electronic printed circuit board according to claim 1, wherein said electronic circuit board includes a radio transmitter comprising at least one said slotted antenna and an electronic component positioned at a bottom of said cavity of the slotted antenna.

10. The electronic printed circuit board according to claim 9, wherein said electronic circuit board comprises a conductor in contact with said electronic component, said conductor being operable to extract heat produced by said electronic component.

11. The electronic printed circuit board according to claim 1, wherein said electronic circuit board includes a radio receiver comprising at least one said slotted antenna and an electronic component positioned at a bottom of said cavity of the slotted antenna.

12. A method for the production of an electronic printed circuit board, said electronic printed circuit board comprising at least one slotted antenna, said slotted antenna comprising a cavity formed in said electronic printed circuit board and a conductive metal layer covering said cavity, said conductive metal layer having opposed major surfaces and multiple slots formed in one of said major surfaces defining openings in said conductive metal layer, said method including photolithography and engraving steps, said method further including:
   a step of removing material from said electronic circuit board is removed to form a said cavity in the thickness direction of the electronic printed circuit board,
   a metallization step in which to form a metallization layer is formed on the walls of the said cavity, and
   a step in which a wafer including said conductive metal layer is applied to said electronic printed circuit board to close said cavity.

13. The method according to claim 12, wherein said method also includes a step in which a plurality of printed circuit wafers are laminated to form said electronic printed circuit board.

* * * * *